… … …

United States Patent [19]

Herndon et al.

[11] Patent Number: 4,488,263

[45] Date of Patent: Dec. 11, 1984

[54] BYPASS CIRCUIT FOR WORD LINE CELL DISCHARGE CURRENT

[75] Inventors: William H. Herndon, Sunnyvale; Jonathan J. Stinehelfer, San Jose, both of Calif.

[73] Assignee: Fairchild Camera & Instrument Corp., Mountain View, Calif.

[21] Appl. No.: 363,198

[22] Filed: Mar. 29, 1982

[51] Int. Cl.³ .............................................. G11C 11/40
[52] U.S. Cl. .................................... 365/189; 365/230; 365/242; 365/243; 307/449; 307/463
[58] Field of Search ............... 365/174, 189, 230, 242, 365/243; 307/463, 449; 357/32, 45, 41

[56]  References Cited
U.S. PATENT DOCUMENTS 4,349,895  9/1982  Isogai .................................. 365/230

Primary Examiner—Robert L. Richardson
Attorney, Agent, or Firm—Kenneth Olsen; Carl Silverman; William H. Murray

[57]  ABSTRACT

A current bypass for a microelectric memory, such as a static RAM, diverts word line discharge current such that the current does not flow through the memory cells of a selected word line or along an upper word line conductor. In a first embodiment, the bypass comprises a resistor R1 (R2) and a diode D10 (D20) in series and coupled between an upper word line conductor 50 and word line discharge current source $V_{CC}$, and a lower word line conductor 51 and word line discharge current sink 42. In another embodiment of the invention, a transistor Q10 (Q20) is used in lieu of the diode. By bypassing current from the upper word line conductor and word line memory cells, metal migration is eliminated and narrower metal lines may be used to form the word lines. By eliminating a flow of steady state discharge current through the memory cells, memory cell current saturation is eliminated.

14 Claims, 4 Drawing Figures

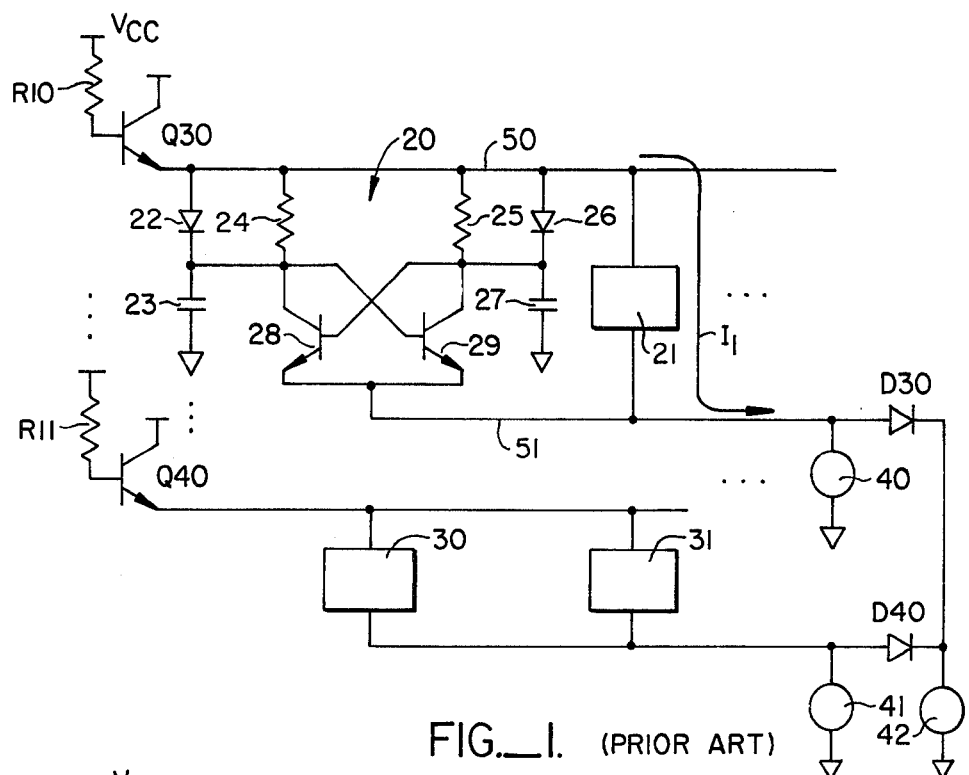
FIG._1. (PRIOR ART)
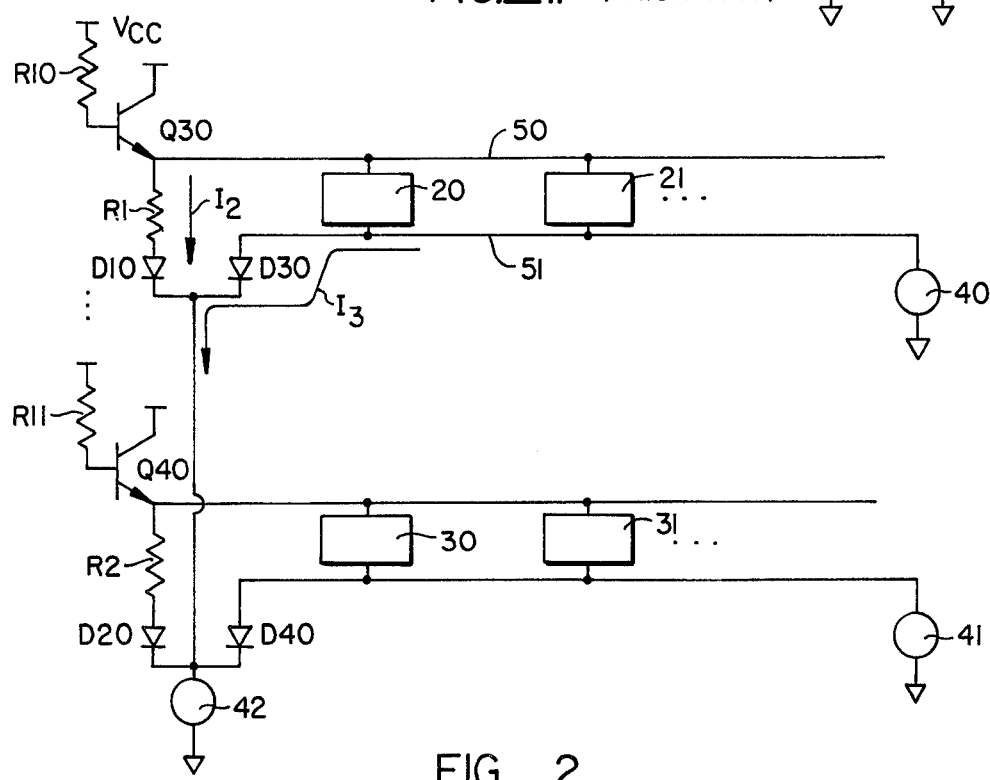
FIG._2.

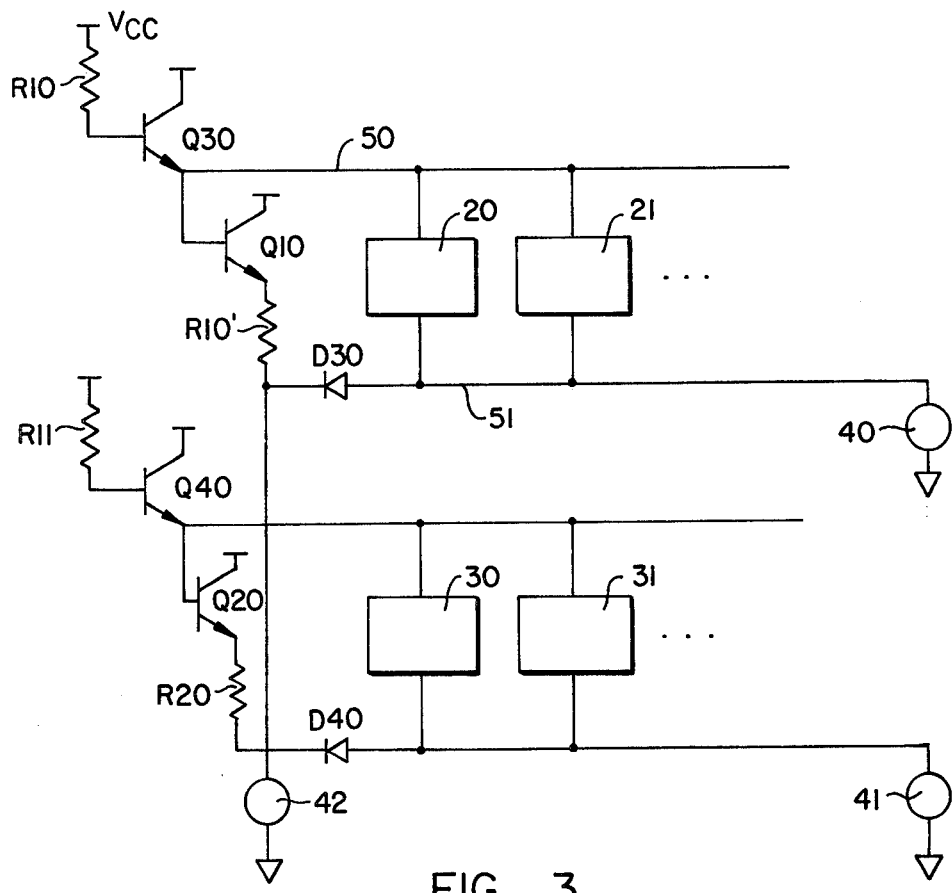
FIG._3.
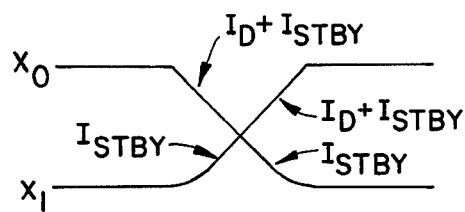
FIG._4.

BYPASS CIRCUIT FOR WORD LINE CELL DISCHARGE CURRENT

BACKGROUND OF THE INVENTION

1. Field of the Invention

The present invention relates to microelectronic memories, and in particular to a circuit for discharging the cells of such a memory without using the word lines.

2. Description of the Prior Art

Since their relatively recent development, semiconductor memories have increased dramatically in size. Semiconductor memories which store more than 4,000 bits (4K) or 8,000 bits (8K) are now widely commercially available. Arrays of this size are small enough that the physical limits for materials from which they are constructed generally are not approached. A discussion of microelectric memories is provided in *Scientific American*, September, 1977, pages 135 through 139.

The recent introduction of 16K, 64K and larger microelectronic memories has created several problems. Among these problems are the phenomena of electromigration or metal migration along conductors and memory cell current saturation.

In most 16K or larger memories, the memory cells are arranged in rows (word lines) and columns (bit lines). Each row has a word line conductor to which each memory cell for that row is connected. Because of the large number of memory cells on each word line in such memories, the word line conductors are relatively long. To increase the packing density of the memory array and all of its associated circuitry on a chip of silicon, the thickness of all conductors, including the word line conductors, must be minimized.

Metal migration occurs when a metal conductor, such as the word line conductor in a microelectronic memory has a high ratio of current flow to cross-sectional area. In large memory arrays, a relatively large amount of current is needed to operate all of the cells on the line. Because the word line conductor may have a cross-sectional area of only a few square microns, current flowing along the word line conductor of only a milliamp may cause metal migration. Metal migration along the conductors results in degradation and eventual disintegration of the conductor.

The problem of memory cell current saturation presents another difficulty in developing the technology of 16K and larger microelectronic memories. The presence of increased current on a selected word line saturates the individual memory cells, degrading their response time significantly. It is not unusual for memory cells to respond ten times more slowly when saturated than in the absence of cell current saturation.

In large microelectronic memory arrays, metal migration and cell current saturation are often exacerbated by certain business practices. A computer system incorporating microelectronic memories occasionally may be turned off. In normal operation, the word lines in the memory are scanned very quickly such that the large currents are present for only a fraction of a second. When the machine is turned off, the word lines are no longer scanned, and a particular word line may remain energized for several hours. It is possible to cause significant damage to the microelectronic memory by allowing such a large flow of current over an extended period of time on a single word line.

SUMMARY OF THE INVENTION

The present invention provides a solution for the problems of metal migration along narrow word line conductors and memory cell current saturation in large microelectronic memory arrays. The present invention includes a resistor for each word line, having a first terminal connected to the upper word line conductor. A diode is connected in series with the resistor between a second resistor terminal and a word line discharge current sink. A second diode is connected between a lower word line conductor and the word line discharge current sink. When a wordline is selected, current supplied from a current source by a word line driver is diverted from the upper word line and the word line memory cells to the word line discharge current sink.

In another embodiment of the present invention, a transistor has a base connected to the upper word line conductor. A resistor is connected in series with the transistor's emitter and the word line discharge current sink. A diode is connected between the lower word line conductor and the word line discharge current sink.

In the preferred embodiment of the present invention, the physical location of the word line cell discharge current bypass on the word line driver end of the word line is a significant factor in bypassing current from the upper word line conductor and from the word line memory cells to the word line discharge current sink.

BRIEF DESCRIPTION OF THE DRAWINGS

The present invention is best understood by referring to the following discussion and drawings, in which:

FIG. 1 is a partial schematic diagram of a typical prior art memory;

FIG. 2 is a partial schematic diagram of a first embodiment of the present invention;

FIG. 3 is a partial schematic diagram of another embodiment of the present invention; and FIG. 4 is a diagram of current values of two adjacent word lines during word line selection.

DESCRIPTION OF THE PREFERRED EMBODIMENTS

A prior art microelectronic memory is schematically illustrated in FIG. 1. At any given time in this memory one of the multiple word lines is selected. A particular word line is selected when an address for the word line is decoded by associated memory circuitry (not shown); a word driver transistor associated with each word line (Q30, Q40) is then made to conduct more current, supplied by a word line discharge current source 41, by increased biasing on its base as a result of decreased voltage drop across a base resistor (R10, R11). The selected word line is made more positive than the other word lines and may be accessed by a microprocessor or other such system hardware (not shown). Memory cells (20, 21, 30, 31) are maintained in a storage state by a standby current source (40, 41) when unselected. In the prior art, all of the standby current and word line discharge current flow (41) through all the cells in the selected word line.

When the selected word line driver (in this example, Q30) is changed from the selected to the unselected state, the word line discharge current serves to discharge the memory cell parasitic capacitance until the voltage at the anode of diode D30 is more negative than the voltage at the anode of diode D40. At this point, diode D30 changes its associated word line from a selected to unselected state; diode D40 changes its associated word line from an unselected to a selected state.

Memory cell parasitic capacitance is mainly comprised of the collector substrate capacitance (23 and 27) of the two transistors (28 and 29) in the memory cell 20 or cross-coupled storage latch. The capacitance is best discharged through the emitters of the transistors in the cross-coupled latch circuit. The latch circuit includes diodes 22 and 26, and resistors 24 and 25.

In FIG. 1, the arrow $I_1$ indicates the current path for standby and discharge current. The full standby and discharge current flows along the upper word line conductor 50 and through all the memory cells.

During memory scanning, when a word line is unselected, another word line is selected. Word line discharge current and memory cell standby current flow along a lower word line conductor through diode D30 to a word line discharge current sink. FIG. 4 is a graphic illustration of the relative currents during this process with $X_0$ corresponding to the current level in an initially selected word line and $X_1$ corresponds to the current level in an initially unselected word line.

During the selected state standby current $I_{STBY}$ and word line discharge current $I_D$ both flow through the selected word line. When the next word line is selected, current flow through the next word line rises until the previously selected word line (now unselected) only has a standby current $I_{STBY}$ flowing through it.

A first embodiment of the present invention is illustrated in FIG. 2 in a partial schematic diagram. When a word line is selected (such as the upper word line 50 in FIG. 2) by applying a current through a resistor associated with the base of the desired word driver transistor, the word driver transistor Q30 conducts more current. Current flow is now directed through series-connected resistor R1 and diode D10 as shown by arrow $I_2$. The physical proximity of resistor R1 and diode D10 to transistor Q30 prevents excessive current flow along the upper word line conductor 50 or through the word line memory cells. It can be seen from the arrow $I_3$ in FIG. 2 that standby current flow from standby current source 40 is along the lower word line conductor 51 through diode D30 and thence to the word line discharge current sink 42.

When the word line goes from a high or selected state to a low or unselected state, a discharge current is produced due to the capacitance of the memory cells. Arrow $I_3$ indicates the direction of discharge current flow through diode D30, as well as standby current flow.

It is preferred that the bypass formed by diode D10 (D20) and resistor R1 (R2) be physically located on the word driver transistor (Q30, Q40) end of the word line. Otherwise, memory cell discharge current would flow through the memory cells and the upper word line conductor before the bypass could divert it to the word line discharge current sink. To assure the bypass operates to divert current from the upper word line conductor and word line memory cells, resistor R1 (R2) and and diode R10 (R20) have a lower voltage drop than that of the individual memory cells on the word line.

A second embodiment of the present invention (FIG. 3) is provided wherein a transistor Q10 has a base connected to the upper word line 50 and the emitter of the word driver transistor Q30. In this arrangement, selection of the word line by biasing word driver transistor Q30 to increase current flow through the transistor in turn biases bypass transistor Q10. Bypass transistor Q10 (Q20) is a high gain device that requires only a slight amount of current drive from word driver transistor Q30 to produce sufficient current flow to operate the word line. Resistor R10' (R20) is provided as a current bypass or load.

In a semiconductor memory, diodes D30 and D40, together with other diodes elsewhere in the circuit, are usually manufactured as transistors which have their collector and base tied together to form the diode. The second embodiment of the invention therefore does not require additional components; a transistor must already be present to produce the diode of the first embodiment of the invention. Therefore, either of the disclosed embodiments of the invention may be selected at the time of the memory's manufacture depending on the particular application to which the memory is to be put and on which embodiment of the invention is best suited for that application.

The present invention contemplates normal word line selection while bypassing potentially damaging word line discharge currents from the upper word line conductor and word line memory cells to a word line discharge current sink.

It is anticipated that the present invention will find many equivalent applications in related microelectronic memory devices such as RAMS, ROMS, PROMS, E-PROMS, etc. These devices or others may be fabricated in any semiconductor process including, but not limited to, bipolar, N MOS, C MOS, etc.

While NPN bipolar transistors are used in the specification to illustrate the invention, MOS transistors could be substituted for the NPN transistors. Therefore, the scope of the invention should be limited only by the breadth of the following claims.

We claim:

1. In a semiconductor memory, a bypass circuit for diverting a flow of word line discharge current from memory cells of a selected word line and from an upper word line conductor to a word line discharge current sink, comprising:

a resistor having a first terminal connected to said upper word line conductor; and a diode connected in series with said resistor, said diode being connected between a second resistor terminal and said word line discharge current sink.

2. The bypass circuit of claim 1, further comprising a second diode connected between a lower word line conductor and said word line discharge current sink.

3. The bypass circuit of claim 1, wherein said microelectronic memory is a random access memory.

4. In a semiconductor memory including a matrix of memory cells arranged in a plurality of word lines, the cells in each word line connected between an upper word line conductor and a lower word line conductor, said word lines being sequentially selectable by operation of a word line driver located at one end of each selected word line, the improvement comprising:

a resistor in each word line having a first terminal connected to said upper word line conductor, said resistor being located on the word line driver's end of said word line; and a diode in each word line connected in series with said resistor, said diode being connected between a second resistor terminal and a word line discharge current sink, said diode being located on the word line driver's end of the word line, wherein a flow of word line discharge current is diverted from said memory cells and from said upper word line conductor of a selected word line to said word line discharge current sink.

5. The improvement of claim 4, further comprising a second diode connected between said lower word line conductor and said word line discharge current sink, said second diode being located on the said word line driver's end of the word line.

6. The improvement of claim 4, wherein the microelectronic memory is a random access memory.

7. In a semiconductor memory, a bypass for diverting a flow of word line discharge current from cells of a selected word line and from an upper word line to a word line discharge current sink, comprising:

a transistor having a base, an emitter, and a collector, the base of said transistor being connected to said upper word line conductor, the collector of said transistor being connected to a word line discharge current source; and a resistor having a first terminal connected to said transistor's emitter and having a second terminal connected to a word line discharge current sink.

8. The bypass circuit of claim 7, further comprising a diode coupled between a lower word line conductor and said word line discharge current sink.

9. The bypass circuit of claim 7, wherein the microelectronic memory comprises a random access memory.

10. In a semiconductor memory including a matrix of memory cells arranged in a plurality of word lines, the cells in each word line connected between an upper word line conductor and a lower word line conductor, said word lines being sequentially selectable by operation of a word line driver located at one end of each selected word line, the improvement comprising:

a transistor having a base, an emitter, and a collector, the base of said transistor being connected to said upper word line conductor, the collector of said transistor being connected to a word line discharge current source;

a resistor having a first terminal connected to said transistor's emitter and having a second terminal connected to a word line discharge current sink;

the transistor and resistor being located on the word line driver's end of the word line, wherein a flow of word line discharge current is diverted from said memory cells and from said upper word line conductor of a selected word line to said word line discharge current sink.

11. The improvement of claim 10, further comprising a second diode connected between the lower word line conductor and the word line discharge current sink, said second diode being located on the word line driver's end of the word line.

12. The improvement of claim 10 wherein the microelectronic memory is a random access memory.

13. In a microelectronic memory, a method for reducing metal migration along upper word line conductors and for reducing memory cell saturation, comprising bypassing a flow of word line discharge current from a word line driver, through a series-connected resistor and diode, to a word line discharge sink.

14. In a microelectronic memory, a method for reducing metal migration along upper word line conductors and for reducing memory cell saturation, comprising bypassing a flow of word line discharge current from a word line driver, through a transistor having a resistor in series with its emitter, to a word line discharge current sink.

* * * * *